United States Patent
Izumi et al.

(10) Patent No.: US 10,002,568 B2
(45) Date of Patent: Jun. 19, 2018

(54) DISPLAY UNIT, DISPLAY UNIT DRIVING METHOD, AND ELECTRONIC APPARATUS WITH DETERIORATION SUPPRESSION

(71) Applicant: JOLED Inc., Tokyo (JP)

(72) Inventors: Gaku Izumi, Tokyo (JP); Mikihiro Yokozeki, Tokyo (JP)

(73) Assignee: JOLED Inc., Tokyo (JP)

( * ) Notice: Subject to any disclaimer, the term of this patent is extended or adjusted under 35 U.S.C. 154(b) by 11 days.

(21) Appl. No.: 15/309,656

(22) PCT Filed: Feb. 13, 2015

(86) PCT No.: PCT/JP2015/053965
§ 371 (c)(1),
(2) Date: Nov. 8, 2016

(87) PCT Pub. No.: WO2015/170493
PCT Pub. Date: Nov. 12, 2015

(65) Prior Publication Data
US 2017/0270861 A1 Sep. 21, 2017

(30) Foreign Application Priority Data

May 9, 2014 (JP) ................................ 2014-097486

(51) Int. Cl.
*G09G 3/32* (2016.01)
*G09G 3/3258* (2016.01)

(52) U.S. Cl.
CPC ... *G09G 3/3258* (2013.01); *G09G 2300/0871* (2013.01); *G09G 2310/0289* (2013.01); *G09G 2310/08* (2013.01)

(58) Field of Classification Search
CPC .................................................. G09G 3/3258
(Continued)

(56) References Cited

U.S. PATENT DOCUMENTS

2008/0198102 A1\* 8/2008 Yamashita ........... G09G 3/3233
345/76
2008/0198103 A1\* 8/2008 Toyomura ............ G09G 3/3233
345/77

(Continued)

FOREIGN PATENT DOCUMENTS

JP    2009-042486 A    2/2009
JP    2010192450 A     9/2010
(Continued)

OTHER PUBLICATIONS

International Search Report for Application No. PCT/JP2015/053965 dated Apr. 13, 2015.

*Primary Examiner* — Long D Pham
(74) *Attorney, Agent, or Firm* — Michael Best & Friedrich LLP

(57) ABSTRACT

A display unit of the disclosure includes a pixel array section and a drive section. In the pixel array section, unit pixels each including a light-emitting section are disposed. The drive section causes, during a non-display period other than a display period, a transistor to be corrected to be in an electrically conductive state, and performs, during the non-display period, light emission driving of the light-emitting section on a basis of a predetermined voltage. The transistor is provided in each of the unit pixels. The display period is a period during which display driving is performed on a basis of a display signal.

11 Claims, 13 Drawing Sheets

(58) Field of Classification Search
USPC .................................................. 345/82, 212
See application file for complete search history.

(56) References Cited

U.S. PATENT DOCUMENTS

| | | | | |
|---|---|---|---|---|
| 2009/0135111 A1* | 5/2009 | Yamamoto | ........... | G09G 3/3233 345/76 |
| 2011/0273483 A1* | 11/2011 | Miura | ................. | G09G 3/3233 345/690 |
| 2012/0162169 A1 | 6/2012 | Ishizuka | | |

FOREIGN PATENT DOCUMENTS

| | | | |
|---|---|---|---|
| JP | 2011-209615 | A | 10/2011 |
| JP | 2013-206919 | A | 10/2013 |
| JP | 2014-6519 | A | 1/2014 |
| WO | 2015/170493 | A1 | 11/2015 |

\* cited by examiner

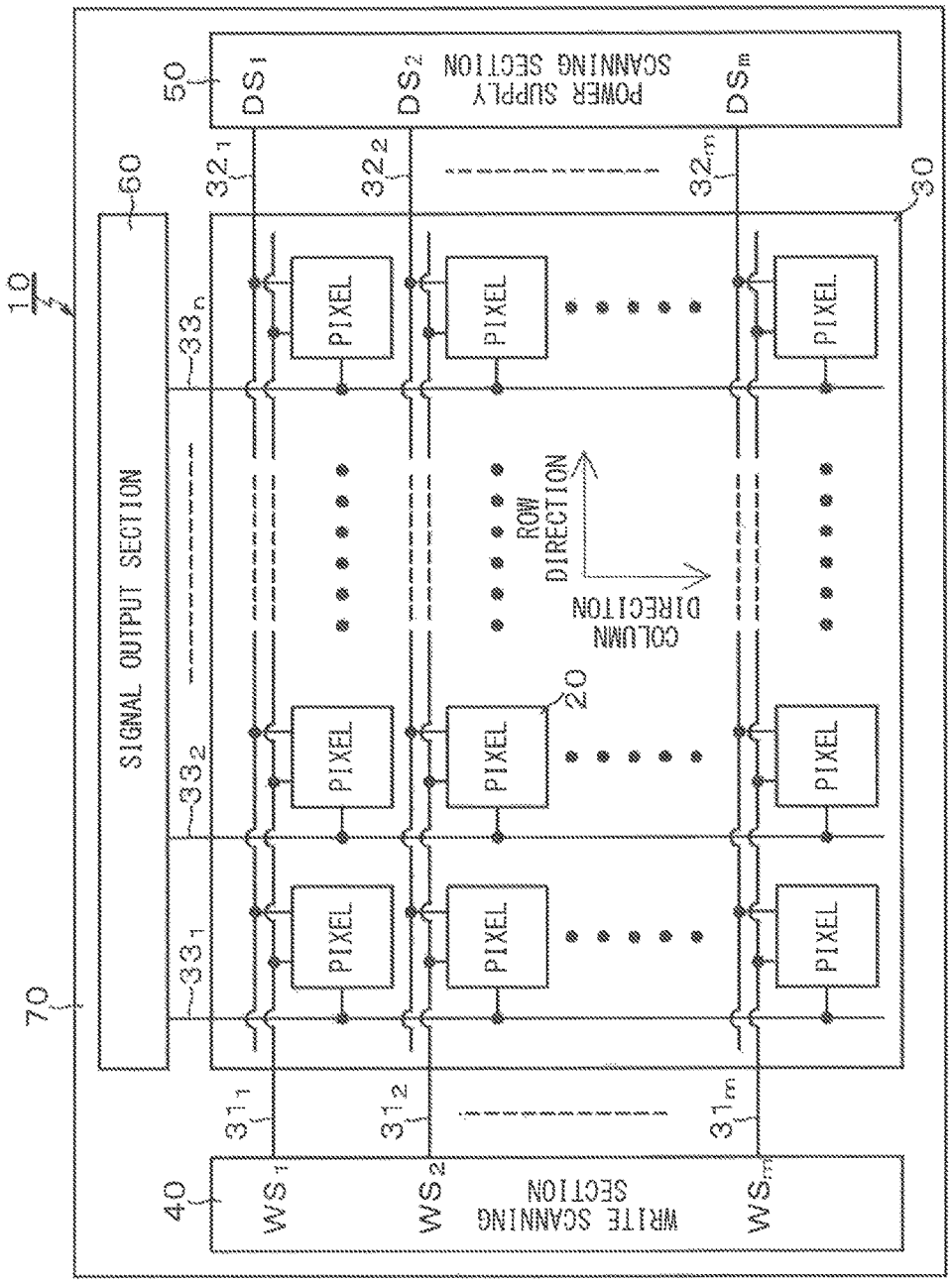
[FIG. 1]

[FIG. 2]
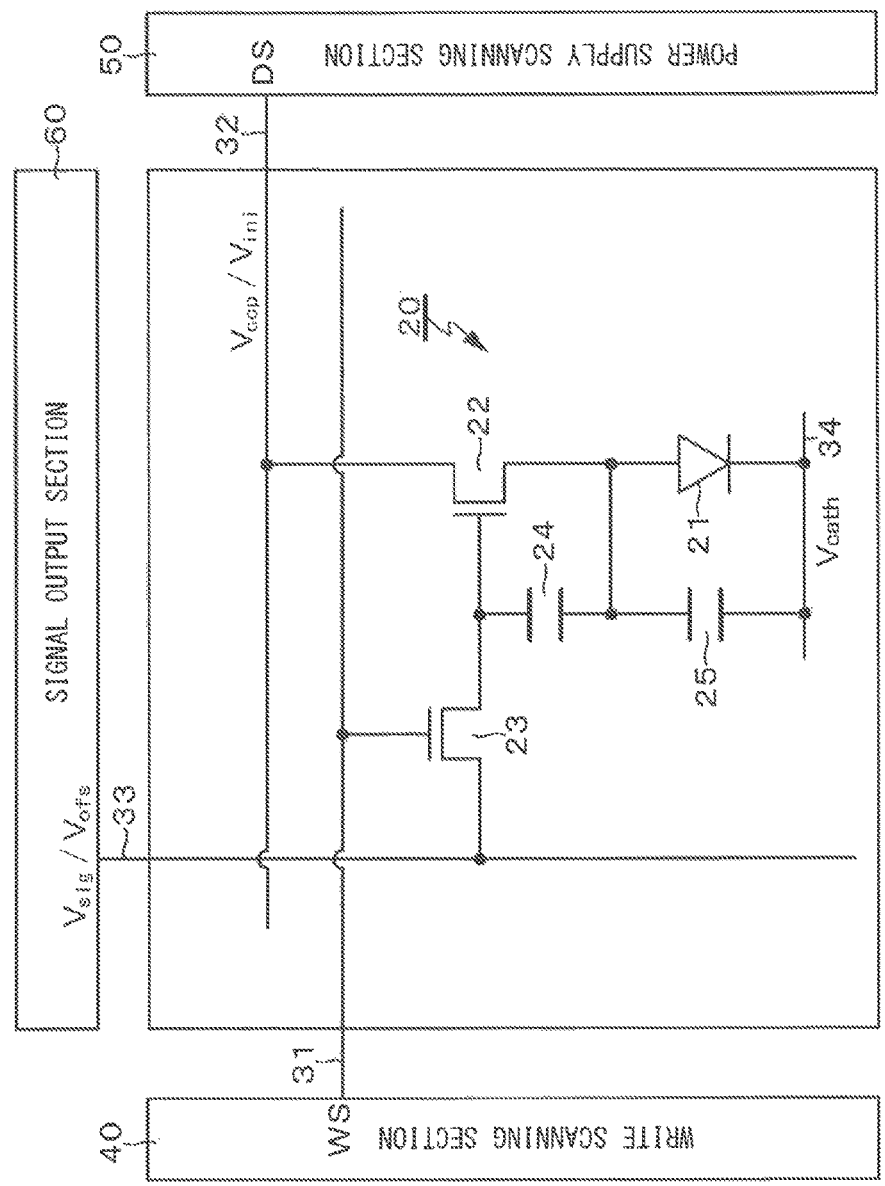

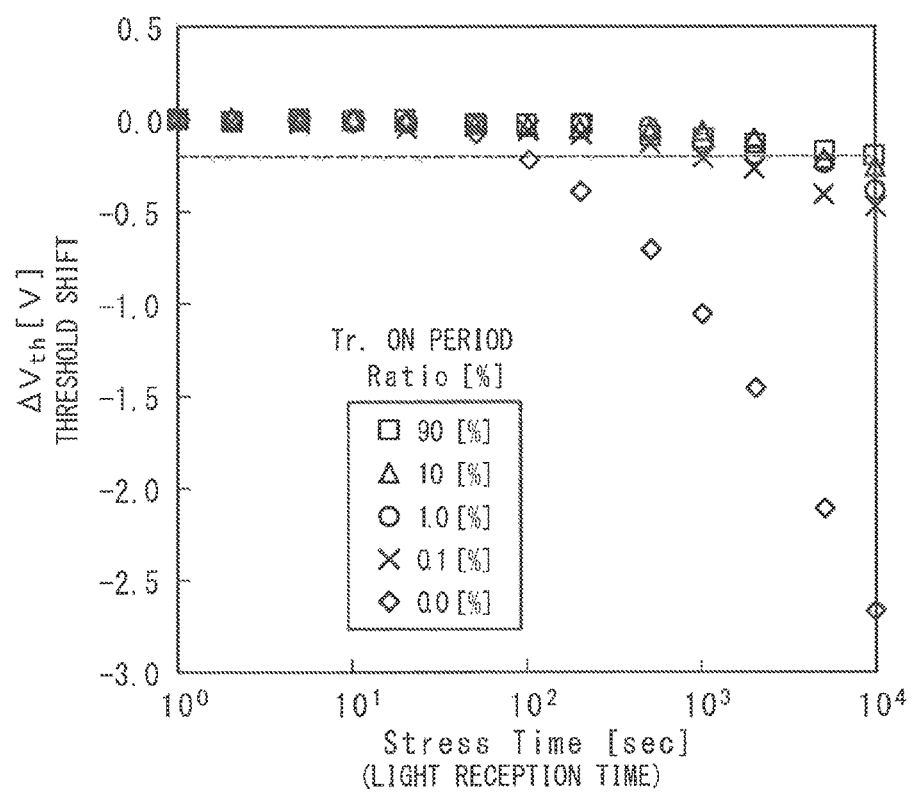
[ FIG. 3 ]

[FIG. 4]
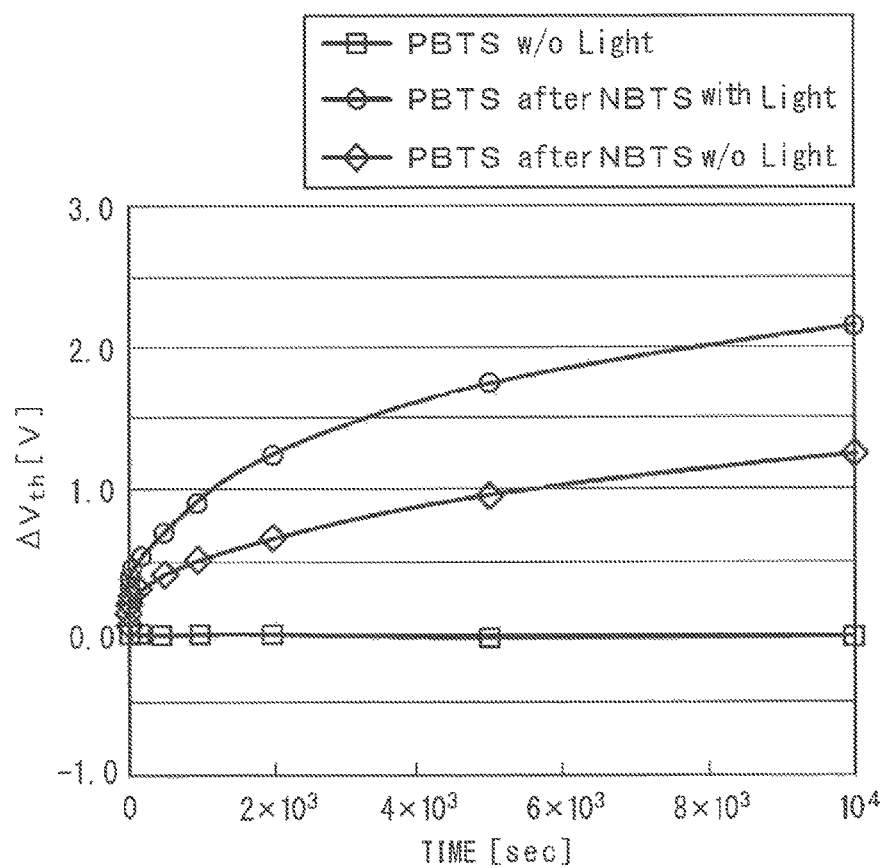

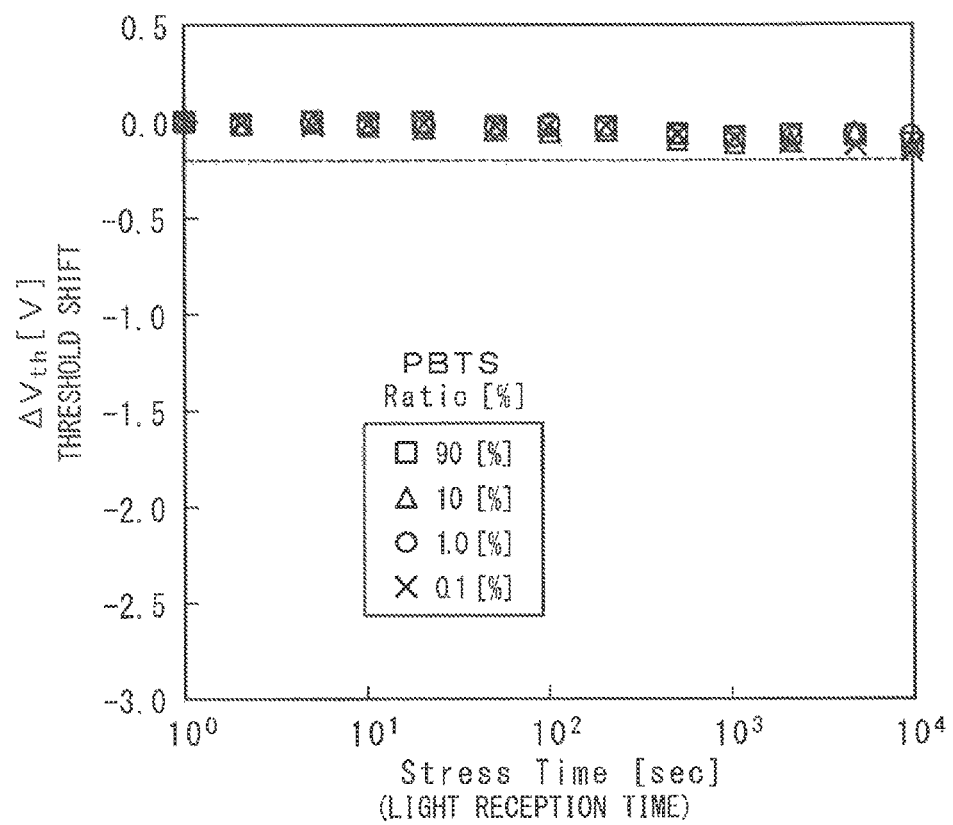

[FIG. 6]
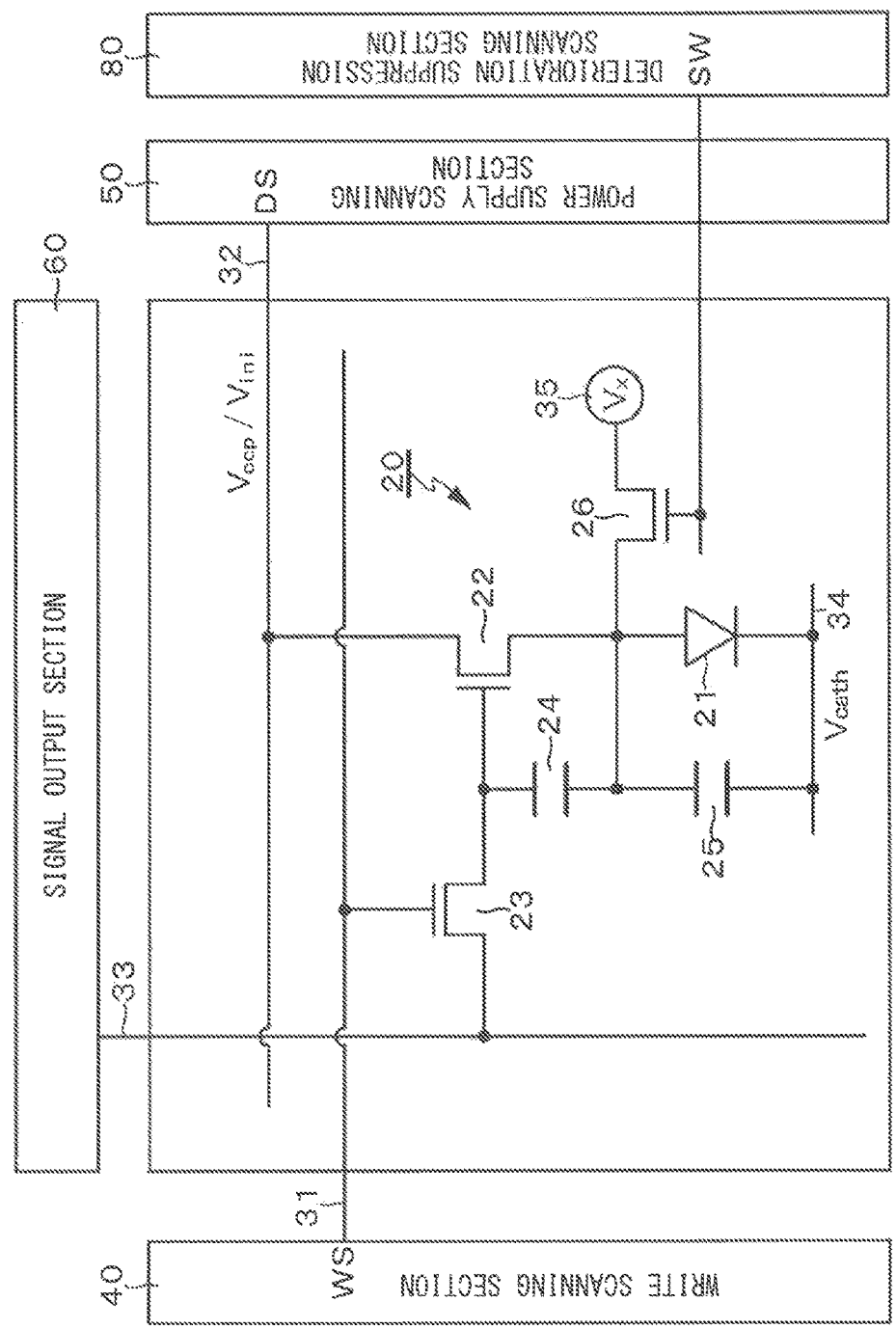

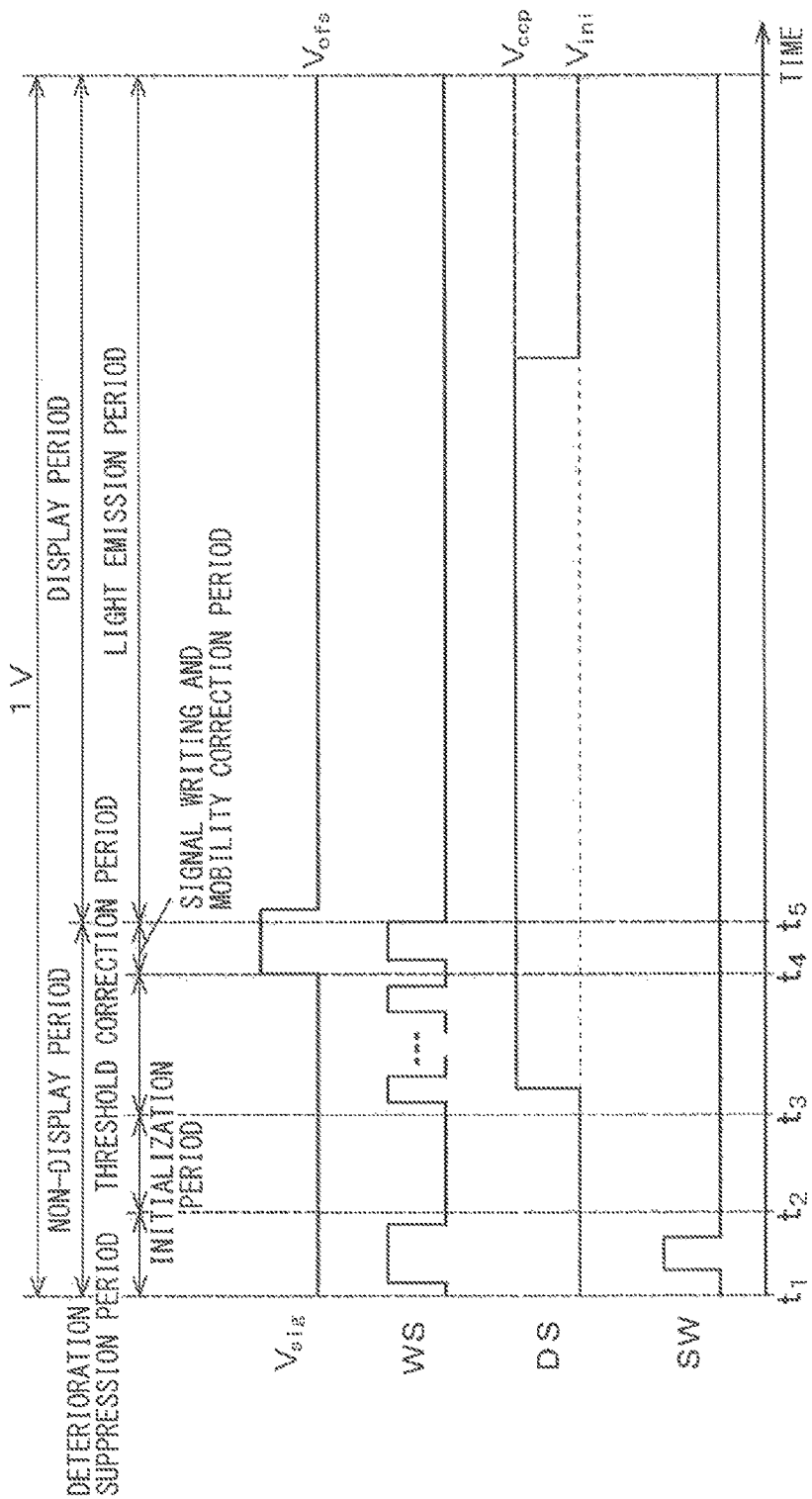
[FIG. 7]

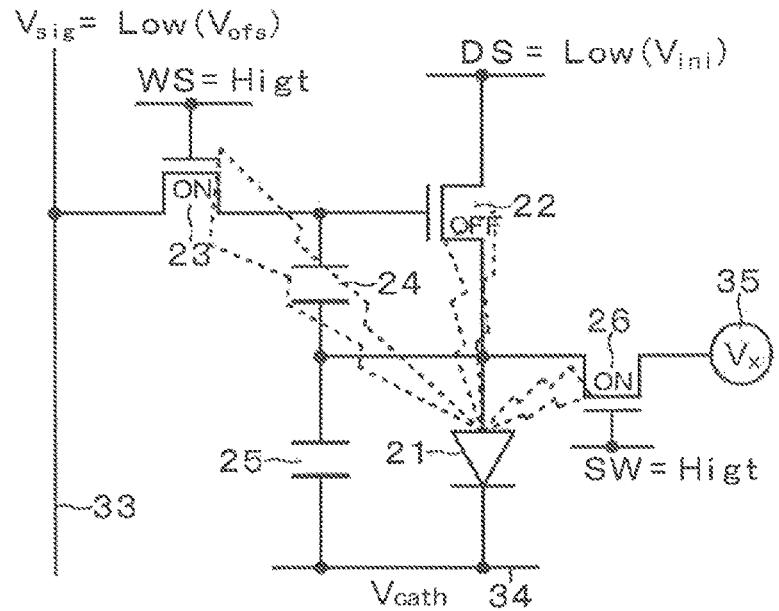
[FIG. 8A]
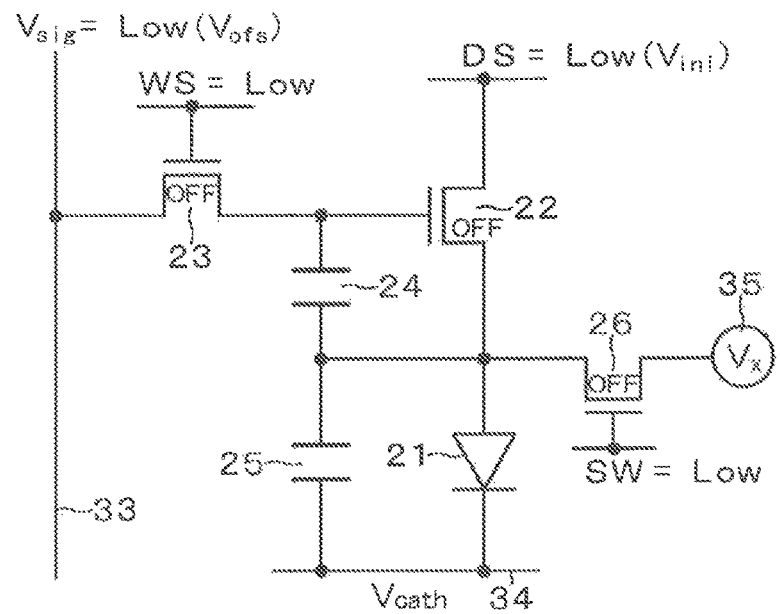
[FIG. 8B]

[ FIG. 9A ]
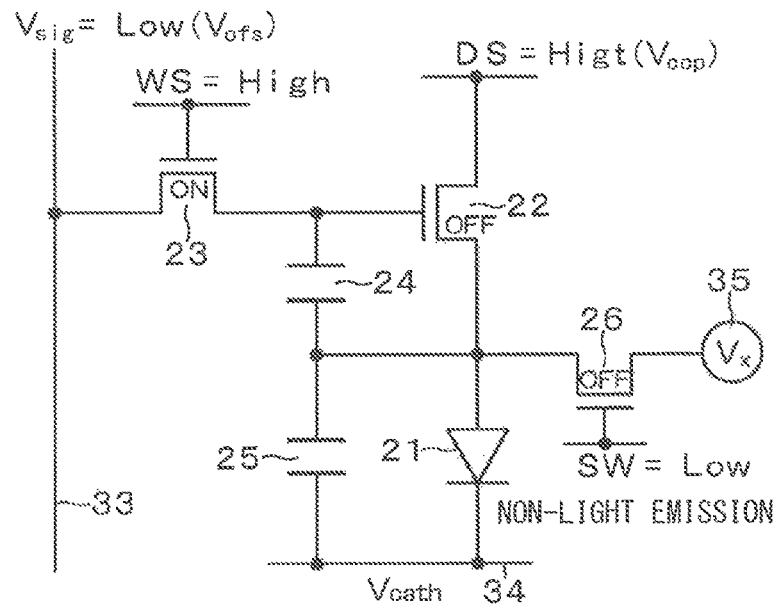
[ FIG. 9B ]
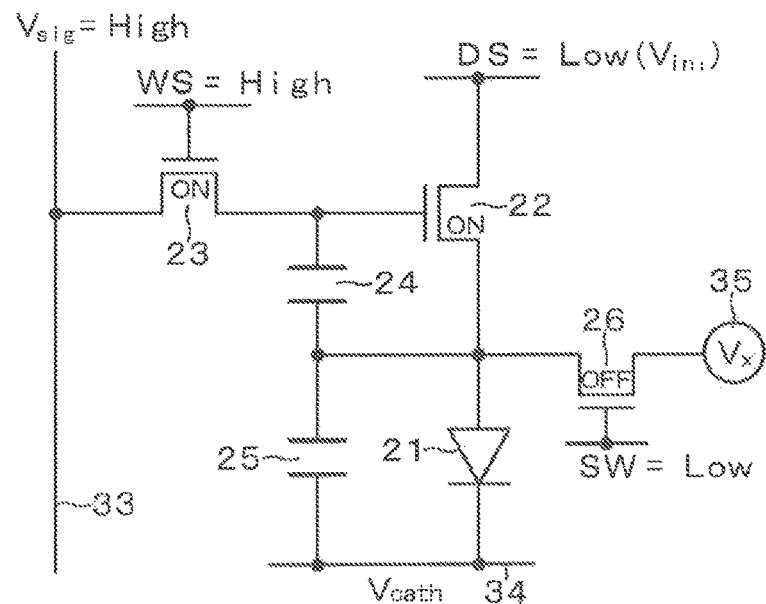

[ FIG. 10 ]
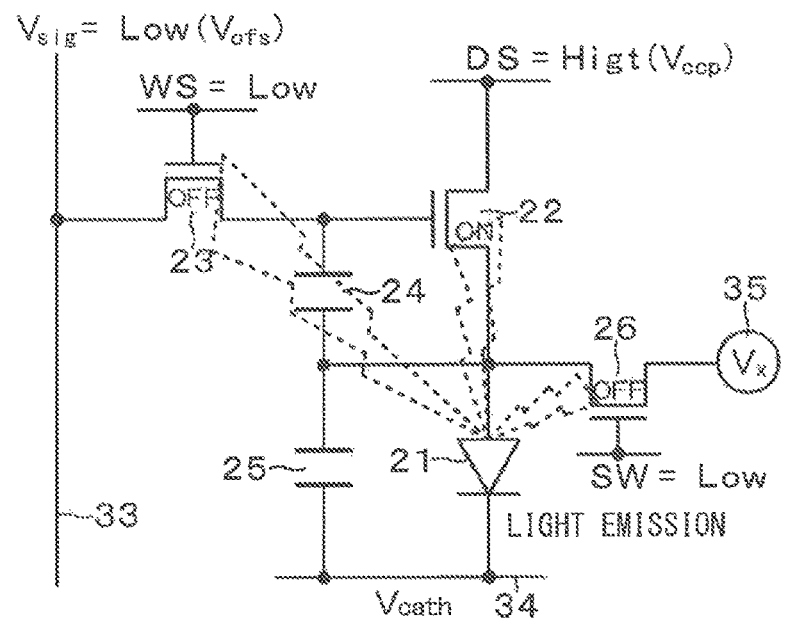

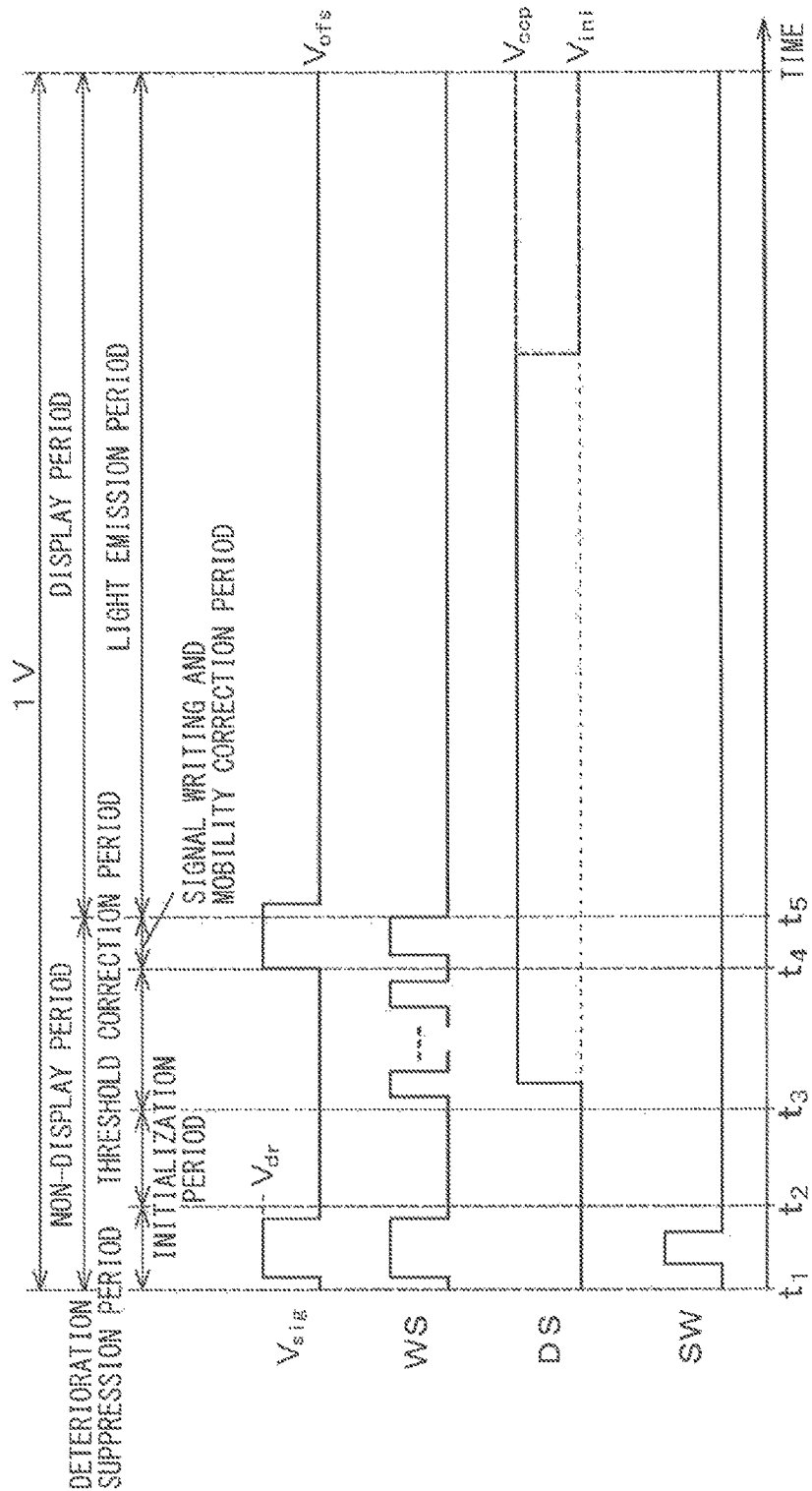

[FIG. 12]
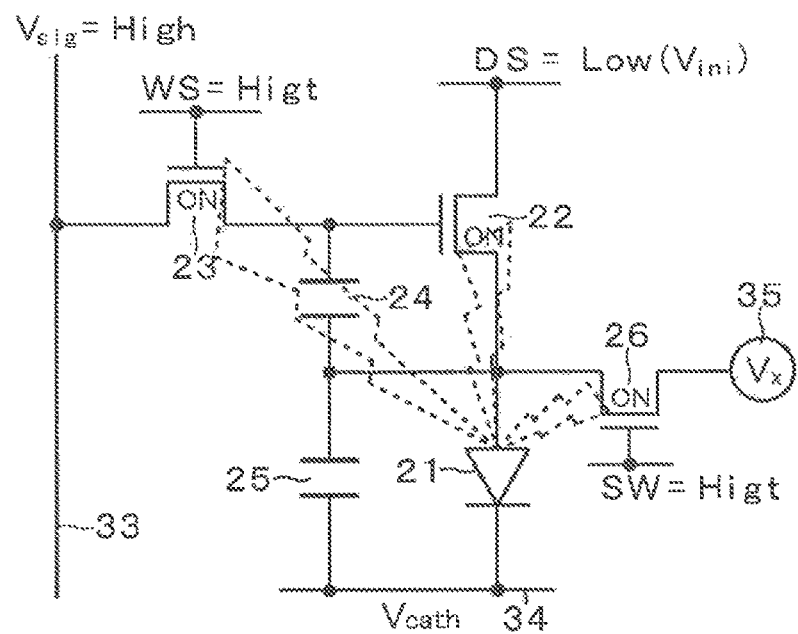

[ FIG. 13 ]
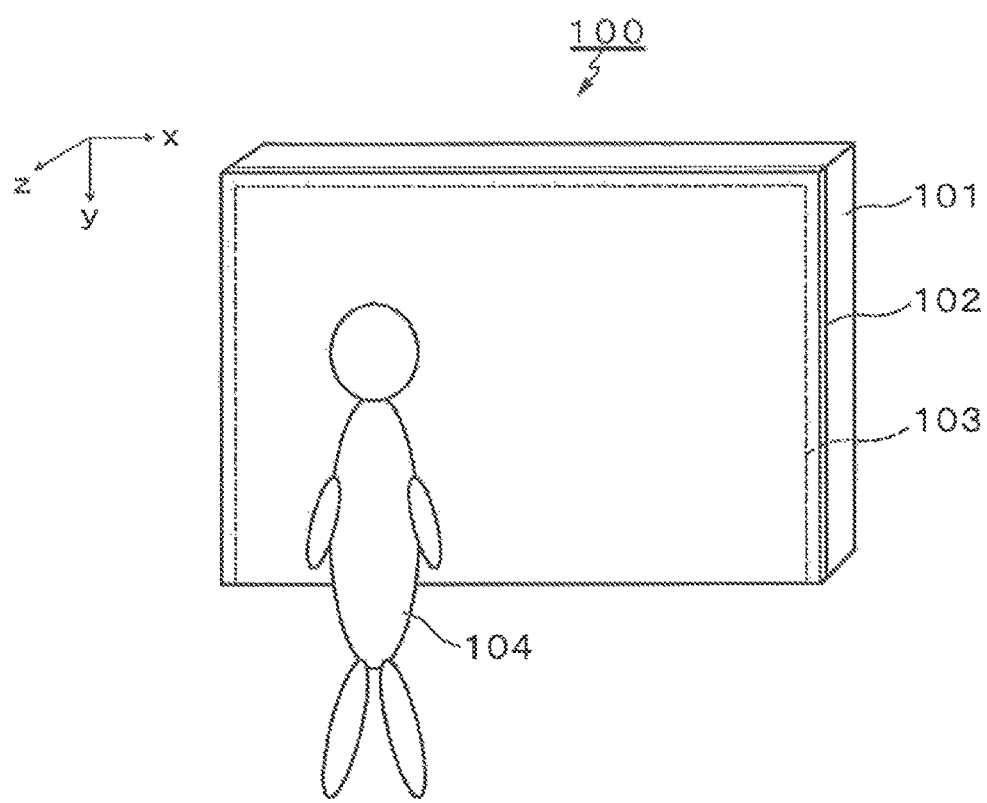

DISPLAY UNIT, DISPLAY UNIT DRIVING METHOD, AND ELECTRONIC APPARATUS WITH DETERIORATION SUPPRESSION

CROSS REFERENCE TO RELATED APPLICATIONS

This application claims the benefit of Japanese Priority Patent Application JP 2014-097486 filed May 9, 2014, the entire contents of which are incorporated herein by reference.

TECHNICAL FIELD

The disclosure relates to a display unit, a display unit driving method, and an electronic apparatus.

BACKGROUND ART

In a display unit in which unit pixels each including a light-emitting section are disposed, the unit pixel includes a transistor for driving the light-emitting section other than the light-emitting section. In such a display unit, a characteristic of the transistor is deteriorated due to reception of light emitted from the light-emitting section of the own pixel. In order to prevent the deterioration of the transistor characteristic caused by the reception of light emitted from the light-emitting section, a light-shielding layer has been typically provided in a unit pixel to block light incident on the transistor (see, e.g., PTL1).

CITATION LIST

Patent Literature

PTL 1: Japanese Unexamined Patent Application Publication No. 2013-206919

SUMMARY OF INVENTION

Technical Problem

As described above, the currently-available technology that adopts a configuration of providing a light-shielding layer in a unit pixel is able to block the light incident on the transistor from the light-emitting section to some degree, but is not able to achieve a structure in which the transistor is completely shielded. Thus, it is difficult to completely block the incident light from the light-emitting section of the own pixel.

An object of the disclosure is to provide a display unit, a display unit driving method, and an electronic apparatus that allow for suppressing the deterioration of transistor characteristic caused by reception of light emitted from a light-emitting section of an own pixel, without depending on a light-shielding layer.

Solution to Problem

To achieve the above-mentioned object, there is provided a display unit including a pixel array section in which unit pixels each including a light-emitting section are disposed, and a drive section that causes a transistor to be corrected in the unit pixel to be in an electrically conductive state and performs light emission driving of the light-emitting section on a basis of a predetermined voltage during a non-display period other than a display period during which display driving is performed on a basis of a display signal.

To achieve the above-mentioned object, there is provided a display unit driving method including, upon driving a display unit provided with a pixel array section in which unit pixels each including a light-emitting section are disposed, causing a transistor to be corrected in each of the unit pixels to be in an electrically conductive state, and performing light emission driving of the light-emitting section on a basis of a predetermined voltage during a non-display period other than a display period during which display driving is performed on a basis of a display signal.

To achieve the above-mentioned object, there is provided an electronic apparatus provided with a display unit, the display unit including a pixel array section in which unit pixels each including a light-emitting section are disposed, and a drive section that causes a transistor to be corrected in the unit pixel to be in an electrically conductive state and performs light emission driving of the light-emitting section on a basis of a predetermined voltage during a non-display period other than a display period during which display driving is performed on a basis of a display signal.

In the pixel unit including the light-emitting section, in a case where the transistor to be corrected is in a certain state, for example, in a case where the transistor to be corrected is in an electrically non-conductive state, the transistor characteristic shifts in a certain direction, when the transistor to be corrected receives light emitted from the light-emitting section of the own pixel. Under this circumstance, during a non-display period during which image display is not influenced, the transistor to be corrected is forced into an electrically conductive state, and the light-emitting section is forced to emit light. This shifts the characteristic of the transistor to be corrected in a direction opposite to the above-mentioned certain direction. The characteristic shift in the opposite direction acts on the characteristic shift in a certain direction so as to reduce the degree of the shift. This makes it possible to suppress the deterioration of the transistor characteristic caused by the reception of light emitted from the light-emitting section of the own pixel, without a light-shielding layer that blocks light from the light-emitting section, i.e., without depending on the light-shielding layer.

Advantageous Effects of Invention

According to a technology of the disclosure, it is possible to suppress the deterioration of the transistor characteristic caused by the reception of light emitted from the light-emitting section of the own pixel without depending on the light-shielding layer, which therefore enables stabilization of the transistor characteristic.

Note that the effects described herein are non-limiting, and may be any effects described in the present specification. Furthermore, the effects described in the present specification are merely illustrative, and not limited thereto. Effects achieved by the technology may be effects other than those described above.

BRIEF DESCRIPTION OF DRAWINGS

FIG. 1 is a system configuration diagram illustrating outline of a basic configuration of an active matrix display unit to which a technology of the disclosure is applied.

FIG. 2 is circuit diagram illustrating an example of a specific circuit configuration of a unit pixel (pixel circuit).

FIG. 3 is a diagram illustrating how deterioration at light reception is improved.

FIG. 4 is a diagram illustrating how $V_{th}$ shifts during PBTS depending on the presence or absence of light reception.

FIG. 5 is a diagram illustrating an effect of combining a light-shielding structure and PBTS/NBTS light reception.

FIG. 6 is a circuit diagram illustrating a pixel circuit according to Embodiment 1.

FIG. 7 is a timing waveform diagram for describing a circuit operation of an organic EL display unit including the pixel circuit according to Embodiment 1.

FIG. 8A is an explanatory operation diagram that describes an operation during a deterioration suppression period, and FIG. 8B is an explanatory operation diagram that describes an operation during an initialization period.

FIG. 9A is an explanatory operation diagram that describes an operation during a threshold correction period, and FIG. 9B is an explanatory operation diagram that describes an operation during signal writing and mobility correction period.

FIG. 10 is an explanatory operation diagram that describes an operation during a light emission period.

FIG. 11 is a timing waveform diagram illustrating a control timing according to Embodiment 2.

FIG. 12 is an explanatory operation diagram that describes an operation during a deterioration suppression period in a case of Embodiment 2.

FIG. 13 is a perspective view of an outer appearance of a digital signage apparatus which is an example of an electronic apparatus of the disclosure.

DESCRIPTION OF EMBODIMENTS

Some embodiments of the technology of the disclosure (hereinafter, referred to as "embodiments") are described in detail below with reference to drawings. The technology of the disclosure is not limited to the embodiments, and various numerical values, materials, and other elements in the embodiments are merely examples. In the following description, the same numerals are used to designate substantially the same components or components having the same function, and overlapped description thereof is omitted. Note that description will be given in the following order.
1. Entire description of display unit, display unit driving method, and electronic apparatus
2. Display unit to which a technology of the disclosure is applied (example of organic EL display unit)
   2-1. System Configuration
   2-2. Pixel Circuit
   2-3. Deterioration of Oxide TFT Characteristic at Light Reception
3. Description of Embodiments of the Disclosure
   3-1. Embodiment 1 [example in which transistor to be corrected is write transistor]
   3-2. Embodiment 2 [example in which transistor to be corrected is drive transistor]
4. Modification
5. Electronic apparatus (example of digital signage apparatus)
   <Entire Description of Display Unit, Display Unit Driving Method, and Electronic Apparatus according to Embodiment of Disclosure>

In the display unit, display unit driving method, and electronic apparatus according to the disclosure, an embodiment may be adopted in which a correction period is provided, during which correction of the transistor characteristic of a unit pixel is performed prior to the entry into a display period. At this time, a configuration may be adopted in which a drive section performs light emission driving of a light-emitting section on the basis of a predetermined voltage prior to the entry into the correction period.

In the display unit, display unit driving method, and electronic apparatus according to the disclosure including the foregoing preferable configuration and embodiment, a configuration may be adopted in which a transistor to be corrected includes a write transistor that writes a display signal into a unit pixel and/or a drive transistor that drives a light-emitting section depending on a display signal. Further, a configuration may be adopted in which the transistor to be corrected includes a thin film transistor employing an oxide semiconductor as a channel layer.

Further, in the display unit, display unit driving method, and electronic apparatus according to the disclosure including the foregoing preferable configuration, a configuration may be adopted in which the unit pixel includes a switching device that selectively applies a predetermined voltage to the light-emitting section in driving the light-emitting section by application of the predetermined voltage. Further, a configuration may be adopted in which the switching device includes a switching transistor coupled between a node of the light-emitting section to which the predetermined voltage is applied and a voltage source of a predetermined voltage. At this time, a configuration may be adopted in which the drive section causes the switching transistor to be in an electrically conductive state when the transistor to be corrected is brought into an electrically conductive state.

Furthermore, in the display unit, display unit driving method, and electronic apparatus according to the disclosure including the foregoing preferable configuration, a configuration may be adopted in which the predetermined voltage is set to have a voltage value that satisfies the following condition:

$$V_g - V_{th\_Tr} > V_x > V_{cath} + V_{th\_EL}$$

where $V_x$ is the predetermined voltage, $V_{cath}$ is a voltage of the node opposite to the node of the light-emitting section to which the predetermined voltage is applied, $V_{th\_EL}$ is a threshold voltage of the light-emitting section, $V_g$ is a gate voltage of the drive transistor, and $V_{th\_Tr}$ is a threshold voltage of the drive transistor.

Alternatively, in the display unit, display unit driving method, and electronic apparatus according to the disclosure including the foregoing preferable configuration, a configuration may be adopted in which the drive section sequentially drives unit pixels on a pixel row basis for a pixel arrangement including unit pixels that are two-dimensionally arranged in matrix. Further, a configuration may be adopted in which each unit pixel of a pixel array section is fabricated on a transparent substrate.

Alternatively, in the display unit, display unit driving method, and electronic apparatus according to the disclosure including the foregoing preferable configuration, a configuration may be adopted in which the light-emitting section of the unit pixel includes a current-driven electrooptical device, e.g., an organic electroluminescence (EL) device. The organic EL device is a self-emitting device that utilizes a phenomenon of light emission as a result of application of an electric field to an organic thin film employing organic material electroluminescence. Examples of the current-driven electrooptical device may include, other than the organic EL device, an inorganic EL device, an LED device, and a semiconductor laser device.

The organic EL device has a configuration in which a hole transport layer, a light-emitting layer, an electron transport layer, and an electron injection layer are sequentially stacked on a first electrode (e.g., anode) to form an organic layer, and a second electrode (e.g., cathode) is formed on the organic layer. Further, a direct current is applied between the first electrode and the second electrode to thereby cause a hole and an electron to be injected, respectively, from the first electrode (anode) through the hole transport layer and from the second electrode (cathode) through the electron transport layer into the light-emitting layer, thus allowing the electron and the hole to be recombined; at this time light is emitted in the light-emitting layer The organic EL display unit employing the organic EL device as a light-emitting section of a pixel has the following feature. That is, in order to drive the organic EL device at an application voltage of 10 V or lower, the organic EL display unit consumes less power. Since the organic EL device is a self-emitting device, the organic EL display unit has higher image visibility, and makes it easier to reduce the weight and the thickness thereof due to non-necessity for an illumination member such as backlight, than a liquid crystal display unit which is the same flat display unit. Moreover, since the organic EL device has a very fast response speed of about several micro seconds, no afterimage occurs in the organic EL display unit during displaying a moving image.

<Display Unit to which Technology of Disclosure is Applied>

[System Configuration]

FIG. 1 is a system configuration diagram illustrating outline of a basic configuration of an active matrix display unit to which a technology of the disclosure is applied.

The active matrix display unit is a display unit that drives the light-emitting section (light-emitting device) using an active device provided in the same pixel as that of the light-emitting section. Non-limiting examples of the active device may include insulated gate field effect transistor. Typically, a thin film transistor (TFT) may be used as the insulated gate field effect transistor.

Here, a description is given referring to, as an example, a case of an active matrix organic EL display unit employing the organic EL device as a light-emitting section (light-emitting device) of a unit pixel (pixel circuit). The organic EL device is a current-driven electrooptical device whose light emission luminance varies in response to a value of a current flowing through a device. Hereinafter, the "unit pixel (pixel circuit)" may be simply referred to as "pixel" in some cases.

As illustrated in FIG. 1, an organic EL display unit 10 to which a technology of the disclosure is applied includes a pixel array section 30 in which a plurality of unit pixels 20, each including an organic EL device, that are two-dimensionally arranged in matrix, and a drive section disposed at the periphery of the pixel array section 30 and drives the pixels 20. The drive section may include, for example, a write scanning section 40, a power supply scanning section 50, a signal output section 60, and other components, which are mounted on a display panel 70 on which the pixel array section 30 is mounted in the same manner. The drive section drives the pixels 20 in the pixel array section 30.

The display panel 70 includes a transparent substrate, for example, a glass substrate as a main substrate. It follows that the display unit according to the disclosure including the display panel 70 with a glass substrate as a main substrate is a transparent display. Note that a configuration may also be adopted in which some or all of the write scanning section 40, the power supply scanning section 50, and the signal output section 60 are provided outside the display panel 70.

Here, in a case where the organic EL display unit 10 supports color display, one pixel (unit pixel/pixel) that is a unit forming a color image is formed of a plurality of sub-pixels. In this case, each of the sub-pixels corresponds to the pixel 20 in FIG. 1. More specifically, in the display unit supporting color display, one pixel may be formed of three sub-pixels, for example, a sub-pixel emitting red (R) light, a sub-pixel emitting green (G) light, and a sub-pixel emitting blue (B) light.

However, configuration of one pixel is not limited to the combination of the sub-pixels of three primary colors RGB. Sub-pixels of one or more colors may also be added to the sub-pixels of three primary colors to configure one pixel. More specifically, for example, a sub-pixel emitting white (W) light may also be added to configure one pixel in order to improve luminance, or one or more sub-pixels emitting complementary color light may also be added to configure one pixel in order to expand color reproduction range.

In the pixel array section 30, with respect to arrangement of the pixels 20 in m rows and n columns, scan lines 31 ($31_1$ to $31_m$) and power supply lines 32 ($32_1$ to $32_m$) are arranged for each pixel row, along a row direction (arrangement direction of the pixels in a pixel row, or horizontal direction). Further, with respect to the arrangement of the pixels 20 in m rows and n columns, signal lines 33 ($33_1$ to $33_n$) are arranged for each pixel column, along a column direction (arrangement direction of the pixels in a pixel column, or vertical direction).

The scan lines $31_1$ to $31_m$ are coupled to respective output ends of corresponding rows of the write scanning section 40. The power supply lines $32_1$ to $32_m$ are coupled to respective output ends of corresponding rows of the power supply scanning section 50. The signal lines $33_1$ to $33_n$ are coupled to respective output ends of corresponding columns of the signal output section 60.

The write scanning section 40 is formed of a shift register circuit and other components. The write scanning section 40 sequentially supplies write scanning signals WS ($WS_1$ to $WS_m$) to the respective scan lines 31 ($31_1$ to $31_m$) to sequentially scan the pixels 20 of the pixel array section 30 by a unit of row, namely, performs so-called line sequential scanning, in writing of the signal voltage of an image signal into the pixels 20 of the pixel array section 30.

The power supply scanning section 50 is formed of a shift register circuit, and other components, similarly to the write scanning section 40. The power supply scanning section 50 supplies power voltages DS ($DS_1$ to $DS_m$) that are able to switch over between a first power voltage $V_{ccp}$ and a second power voltage $V_{ini}$ that is lower than the first power voltage $V_{ccp}$, to the respective power supply lines 32 ($32_1$ to $32_m$) in synchronization with the line sequential scanning by the write scanning section 40. As described later, control of light emission and non-light emission (extinction) of the pixels 20 is performed by switching over between $V_{ccp}$ and $V_{ini}$ of the power voltage DS.

The signal output section 60 selectively outputs a signal voltage $V_{sig}$ of the image signal and a reference voltage $V_{ofs}$ corresponding to luminance information as a display signal supplied from a signal supply source (not illustrated) (hereinafter, simply referred to as "signal voltage" in some cases). Here, the reference voltage $V_{ofs}$ is a reference voltage for the signal voltage $V_{sig}$ of the image signal (for example, a voltage corresponding to black level of the image signal), and is used in threshold correction processing described later.

The signal voltage $V_{sig}$ or the reference voltage $V_{ofs}$ outputted from the signal output section 60 is written into the pixels 20 of the pixel array section 30 through the respective signal lines 33 ($33_1$ to $33_n$) on a basis of a pixel row selected by the scanning of the write scanning section 40. In other words, the signal output section 60 employs a driving mode of line sequential writing in which the signal voltage $V_{sig}$ is written on a row (line) basis.

[Pixel Circuit]

FIG. 2 is circuit diagram illustrating an example of a specific circuit configuration of the unit pixel (pixel circuit) 20. A light emitting section of the pixel 20 includes an organic EL device 21 that is an example of a current-driven electrooptical device whose light emission luminance varies in response to a value of a current flowing through a device.

As illustrated in FIG. 2, the pixel 20 includes the organic EL device 21 and a drive circuit that allows a current to flow through the organic EL device 21 to drive the organic EL device 21. The organic EL device 21 has a cathode electrode coupled to a common power line 34 that is provided commonly to all of the pixels 20.

The drive circuit that drives the organic EL device 21 includes a drive transistor 22, a write transistor 23, a retention capacitor 24, and an auxiliary capacitor 25. In other words, the drive circuit has a circuit configuration of 2Tr2C including two transistors (Tr) and two capacitors (C). Here, an N-channel transistor is used as each of the drive transistor 22 and the write transistor 23. However, a combination in conduction type of the drive transistor 22 and the write transistor 23 described herein is merely an example, and the combination in conduction type of the drive transistor 22 and the write transistor 23 is not limited to the combination described herein.

One of electrodes (source-drain electrode) of the drive transistor 22 is coupled to an anode electrode of the organic EL device 21, and the other electrode thereof (source-drain electrode) is coupled to the power supply line 32 ($32_1$ to $32_m$). One of electrodes (source-drain electrode) of the write transistor 23 is coupled to the signal line 33 ($33_1$ to $33_n$), and the other electrode thereof (source-drain electrode) is coupled to a gate electrode of the drive transistor 22. Further, the gate electrode of the write transistor 23 is coupled to the scan line 31 ($31_1$ to $31_m$).

In the drive transistor 22 and the write transistor 23, one of the electrodes refers to a metal wiring line electrically coupled to one of source-drain regions, and the other electrode refers to a metal wiring line electrically coupled to the other of source-drain regions. Further, depending on a potential relationship between one and the other of electrodes, the one of electrodes serves as a source electrode or a drain electrode, and the other of electrodes serves as a drain electrode or a source electrode.

One of electrodes of the retention capacitor 24 is coupled to the gate electrode of the drive transistor 22, and the other electrode thereof is coupled to the other electrode of the drive transistor 22 and the anode electrode of the organic EL device 21. One and the other of electrodes of the auxiliary capacitor 25 are coupled, respectively, to the anode electrode and a cathode electrode of the organic EL device 21. In other words, one and the other of electrodes of the auxiliary capacitor 25 are coupled to the organic EL device 21 in parallel.

In the above-described configuration, each of the drive transistor 22 and the write transistor 23 is formed of a thin film transistor (TFT) employing, as a channel layer, an oxide semiconductor such as zinc oxide or an oxide containing oxygen and indium. In other words, each of the drive transistor 22 and the write transistor 23 is formed of an oxide TFT. As described later, the drive transistor 22 and the write transistor 23 each formed of the oxide TFT is a transistor to be corrected, to which a technology of the disclosure is applied.

The write transistor 23 is brought into an electrically conductive state in response to the write scanning signal WS, in which a high-voltage state is an active state, that is applied to the gate electrode thereof from the write scanning section 40 through a scan line 31. As a result, the write transistor 23 samples the signal voltage $V_{sig}$ of the image signal corresponding to the luminance information or the reference voltage $V_{ofs}$, which is supplied from the signal output section 60 through the signal line 33 at different timings, and writes the sampled voltage into the pixel 20. The signal voltage $V_{sig}$ or the reference voltage $V_{ofs}$ that has been written by the write transistor 23 is retained by the retention capacitor 24.

When the power voltage DS of the power supply line 32 ($32_1$ to $32_m$) is at the first power voltage $V_{ccp}$, one of the electrodes of the drive transistor 22 serves as a drain electrode and the other electrode serves as a source electrode, and therefore the drive transistor 22 operates in a saturated region. As a result, the drive transistor 22 is supplied with a current from the power supply line 32 to perform light emission driving of the organic EL device 21 by current driving. More specifically, the drive transistor 22 operates in the saturated region to supply the organic EL device 21 with a drive current of a current value corresponding to the voltage value of the signal voltage $V_{sig}$ retained by the retention capacitor 24, and performs current driving of the organic EL device 21 to allow the organic EL device 21 to emit light.

Further, when the power voltage DS is switched over from the first power voltage $V_{ccp}$ to the second power voltage $V_{ini}$, one of the electrodes of the drive transistor 22 serves as the source electrode and the other electrode serves as the drain electrode, and thus the drive transistor 22 operates as a switching transistor. As a result, the drive transistor 22 stops supplying the drive current to the organic EL device 21 to bring the organic EL device 21 into a non-light emission state. In other words, the drive transistor 22 also has a function of a transistor that controls light emission and non-light emission of the organic EL device 21.

By the switching operation of the drive transistor 22, it is possible to provide a period (a non-light emission period) in which the organic EL device 21 is in a non-light emission state, and to control rates (duty) of the light emission period and the non-light emission period of the organic EL device 21. The duty control makes it possible to reduce afterimage blur caused by light emission of the pixel over one display frame period, and therefore, it is possible to make image quality of a moving image more excellent in particular.

Out of the first and second power voltages $V_{ccp}$ and $V_{ini}$ that are selectively supplied from the power supply scanning section 50 through the power supply line 32, the first power voltage $V_{ccp}$ is a power voltage to supply the drive transistor 22 with the drive current that is used to perform light emission driving of the organic EL device 21. Further, the second power voltage $V_{ini}$ is a power voltage to apply reverse bias to the organic EL device 21. The second power voltage $V_{ini}$ is set to a voltage lower than the reference voltage $V_{ofs}$. For example, when a threshold voltage of the drive transistor 22 is denoted as $V_{th}$, the second power voltage $V_{ini}$ is set to a voltage lower than $V_{ofs}-V_{th}$. Preferably, the second power voltage $V_{ini}$ is set to a voltage sufficiently lower than $V_{ofs}-V_{th}$.

Each of the pixels 20 in the pixel array section 30 has a function of correcting variation in the drive current caused by variation in a characteristic of the drive transistor 22. Examples of the characteristic of the drive transistor 22 may include a threshold voltage $V_{th\_Tr}$ of the drive transistor 22 and mobility u of a semiconductor thin film forming a channel of the drive transistor 22 (hereinafter, simply referred to as "mobility u of the drive transistor 22").

The correction of the variation in the drive current caused by the variation in the threshold voltage $V_{th\_Tr}$ (hereinafter, may be referred to as "threshold correction") is performed by initializing the gate voltage $V_g$ of the drive transistor 22 to the reference voltage $V_{ofs}$. Specifically, an operation is performed, in which a source voltage $V_s$ of the drive transistor 22 is varied toward a potential. The potential is obtained by subtracting the threshold voltage $V_{th}$ of the drive transistor 22 from an initialization voltage (reference voltage $V_{ofs}$) of the gate voltage $V_g$ of the drive transistor 22 as a reference. As this operation proceeds, a gate-source voltage $V_{gs}$ of the drive transistor 22 soon converges on the threshold voltage $V_{th\_Tr}$ of the drive transistor 22. A voltage equivalent to the threshold voltage $V_{th\_Tr}$ is retained by the retention capacitor 24. The retaining the threshold voltage $V_{th\_Tr}$ makes it possible to suppress the dependency of the drain-source current $I_{ds}$, flowing through the drive transistor 22 in driving by the drive transistor 22 with the signal voltage $V_{sig}$ of the image signal.

In contrast, correction of variation in the drive current caused by variation in the mobility u (hereinafter, may be also referred to as "mobility correction") is performed by flowing a current via the drive transistor 22 through the retention capacitor 24, with the signal voltage $V_{sig}$ of the image signal being written by the write transistor 23 that is in an electrically conductive state. In other words, the correction of variation in the drive current is performed by applying a negative feedback to the retention capacitor 24 by a feedback amount (correction amount) corresponding to the current $I_{ds}$ flowing through the drive transistor 22. The above-described threshold correction allows the dependency of the drain-source current $I_{ds}$ on the threshold voltage $V_{th}$ to have been already negated at the time when the image signal is written, so that the drain-source current $I_{ds}$ depends on the mobility u of the drive transistor 22. Therefore, by applying a negative feedback to the drain-source voltage $V_{ds}$ of the drive transistor 22 by a feedback amount corresponding to the current $I_{ds}$ flowing through the drive transistor 22, it becomes possible to suppress dependency of the drain-source current $I_{ds}$ flowing through the drive transistor 22 on the mobility u.

In the pixel 20 configured as described above, the auxiliary capacitor 25 serves to complement a capacitance of the organic EL device 21. Therefore, the auxiliary capacitor 25 is not an essential component. In other words, the drive circuit of the organic EL device 21 is not limited to the one having the foregoing circuit configuration of 2Tr2C, but may also adopt a circuit configuration of 2Tr1C excluding the auxiliary capacitor 25 when a sufficient capacitance of the organic EL device is secured. Further, a circuit configuration may also be adopted in which a switching transistor is added as needed.

[Deterioration of Characteristic of Oxide TFT at Light Reception]

Incidentally, in a pixel circuit including TFT, in particular, a pixel circuit employing an oxide TFT such as the drive transistor 22 and the write transistor 23, the characteristics of these transistors 22 and 23 deteriorate due to reception of light emitted from the organic EL device 21 of the own pixel by the drive transistor 22 and the write transistor 23 (deterioration at light reception). One example thereof is a shift of the threshold voltage $V_{th}$ of the drive transistor 22 and the write transistor 23 due to reception of light emitted from the organic EL device 21 ($V_{th}$ shift).

On the other hand, it was confirmed by the inventors that the deterioration at light reception is suppressed by establishing a condition of light reception in a positive bias temperature stress (PBTS) state after light reception in an negative bias temperature stress (NBTS) state, depending on light emission intensity of the organic EL device 21, even in a case of a duty of about 0.1%. As used herein, the term "duty of about 0.1%" means instantaneous light emission. FIG. 3 illustrates how the deterioration at light reception is improved.

As described above, a reason why the deterioration at light reception is able to be suppressed by establishing a condition of the light reception in the PBTS state after the light reception in the NBTS state is because of characteristics of opposite voltage shift directions between cases when the transistor is in the NBTS state and when the transistor is in the PBTS state. FIG. 4 illustrates how $V_{th}$ shifts during the PBTS depending on the presence or absence of light reception. Therefore, by establishing both the NBTS state and the PBTS state, it becomes possible to offset the shift directions of the threshold voltage $V_{th}$, resulting in stabilization of the transistor characteristic.

The change in the degree of the $V_{th}$ shift depending on intensity of received light eventually means that "no light reception" is the best solution, and thus complete shielding of light incident on the transistor is also considered to be sufficient. Further, the use of light-shielding structure and light reception at both the PBTS and the NBTS in combination is also considered to increase the effect of stabilizing the transistor characteristic. FIG. 5 illustrates an effect of the combination of the light-shielding structure and PBTS/NBTS light reception. As can be seen from FIG. 5, the combination of the light-shielding structure and the PBTS/NBTS light reception allows the $V_{th}$ shift to be equal to or lower than −0.2[V] at 10,000 [sec].

In particular, in a case of a transparent display employing a transparent substrate as a substrate of the display panel 70, however, the area of a shielding material such as a light-shielding layer may be a cause of lowering the transmissivity (transparency) of the display panel 70, thus resulting in loss of features of the display panel 70 to be achieved.

In the pixel circuit of the organic EL display unit, it is relatively easy for the drive transistor 22 in the electrically conductive state during light emission of the organic EL device 21 to establish a light reception state in the PBTS, whereas it is not possible for the write transistor 23 to establish the light reception state in the PBTS. This is because the write transistor 23 used for writing an electric charge into the retention capacitor 24 for gradation control is typically in an electrically non-conductive state during light emission of the organic EL device 21, since a pixel having undergone signal writing emits light.

Further, the drive transistor 22 is not able to establish the situation of light reception in the PBTS state, either, in duration of the display state of black (non-light emission) pixel for a long period of time, even if the drive transistor 22 is in the PBTS state.

<Description of Embodiment of the Disclosure>

To address such circumstances, in an embodiment of the disclosure, during a non-display period during which image display is not influenced, the transistor to be corrected is forced into an electrically conductive state and the organic EL device 21 of an own pixel is forced to emit light, thereby correcting the deterioration, at light reception, of the characteristic of the transistor to be corrected. In the pixel circuit illustrated in FIG. 2, the drive transistor 22 and the write transistor 23 are transistors to be corrected. In the following, specific embodiments are described, in which the correction of the deterioration, at light reception, of the transistor to be corrected is performed.

Embodiment 1

FIG. 6 is a circuit diagram illustrating a pixel circuit according to Embodiment 1. In Embodiment 1, the write transistor 23 that writes a display signal (signal voltage $V_{sig}$ of image signal) into the unit pixel 20 is set as a transistor to be corrected.

As illustrated in FIG. 6, the pixel circuit 20 according to Embodiment 1 has a configuration that includes a switching device that selectively applies a predetermined voltage $V_x$ to the organic EL device 21, specifically, a switching transistor 26, in addition to the organic EL device 21, the drive transistor 22, the write transistor 23, the retention capacitor 24, and the auxiliary capacitor 25. The switching transistor 26 is formed of an N-channel oxide TFT, similarly to the drive transistor 22 and the write transistor 23. The switching transistor 26 is coupled between the anode electrode (node to which the predetermined voltage $V_x$ is applied) of the organic EL device 21 and a fixed voltage power source 35 having the predetermined voltage $V_x$.

The drive section that drives the pixel circuit 20 according to Embodiment 1 includes a deterioration suppression scanning section 80, in addition to the write scanning section 40, the power supply scanning section 50, and the signal output section 60. The deterioration suppression scanning section 80 sequentially drives the unit pixels 20 on a pixel row basis in synchronization with line sequential scanning by the write scanning section 40. More specifically, the deterioration suppression scanning section 80 outputs a control signal SW. The control signal SW is brought into an active state (in this example, high voltage) during a deterioration suppression period during which the suppression (correction) of the deterioration of the write transistor 23 at light reception is performed. The control signal SW is applied to a gate electrode of the switching transistor 26.

Next, a description is given of a circuit operation of the organic EL display unit 10 including the pixel circuit 20 according to Embodiment 1 configured as described above, on the basis of the timing waveform diagram of FIG. 7 and the explanatory operation diagrams of FIGS. 8 to 10. Note that the circuit operation described below is performed under the drive of driving sections such as the write scanning section 40, the power supply scanning section 50, and the deterioration suppression scanning section 80.

The timing waveform diagram of FIG. 7 illustrates waveforms of the signal voltage $V_{sig}$ of the image signal, the write scanning signal WS, the voltage (power voltage) DS of the power supply line 32, and the control signal SW during one vertical period (1V). Note that, since the write transistor 23 and the switching transistor 26 are each the N-channel transistors, the high-voltage states of the write scanning signal WS and the control signal SW serve as an active state, and the low-voltage states thereof serve as a non-active state. The write transistor 23 and the switching transistor 26 are brought into an electrically conductive state (ON) when the write scanning signal WS and the control signal SW are in an active state; whereas the write transistor 23 and the switching transistor 26 are brought into an electrically non-conductive state (OFF) when the write scanning signal WS and the control signal SW are in a non-active state.

(Deterioration Suppression Period)

The period from time $t_1$ to time $t_2$ during which the power voltage DS is at a low voltage (Low), i.e., at the second power voltage $V_{ini}$ is a deterioration suppression period during which suppression (correction) of the deterioration of the write transistor 23 at light reception is performed. The deterioration suppression period is set at a non-display period during which image display is not influenced. A circuit operation during the deterioration suppression period is described with reference to the explanatory operation diagram of FIG. 8A. During the deterioration suppression period $t_1$-$t_2$, the signal line 33 is in a state of low voltage (Low), i.e., in a state of the reference voltage $V_{ofs}$, thus bringing the write scanning signal WS and the control signal SW into an active state. This brings the write transistor 23 and the switching transistor 26 into the electrically conductive state (ON).

Even when the write transistor 23 is brought into the electrically conductive state, the voltage of the signal line 33 is at the reference voltage $V_{ofs}$, and the drive transistor 22 remains in the non-electrically conductive state (OFF), even when such reference voltage $V_{ofs}$ is written by the write transistor 23. By bringing the switching transistor 26 into the electrically conductive state, the predetermined voltage $V_x$ from the fixed voltage power source 35 is applied to the anode electrode of the organic EL device 21. During periods other than the deterioration suppression period $t_1$-$t_2$, the control signal SW is in the non-active state, and thus the switching transistor 26 is in the electrically non-conductive state (OFF).

Here, the predetermined voltage is set to have a voltage value that satisfies the following condition:

$$V_g - V_{th\_Tr} > V_x > V_{cath} + V_{th\_EL}$$

where $V_x$ is the predetermined voltage, $V_{cath}$ is a voltage of the cathode electrode of the organic EL device 21, $V_{th\_EL}$ is a threshold voltage of the organic EL device 21, $V_g$ is a gate voltage of the drive transistor 22, and $V_{th\_Tr}$ is a threshold voltage of the drive transistor 22.

By applying the predetermined voltage $V_x$ having the voltage value that satisfies the foregoing condition to the anode electrode of the organic EL device 21, a forward bias is applied to the organic EL device 21, thus causing the organic EL device 21 to emit light. That is, during the deterioration suppression period $t_1$-$t_2$, the organic EL device 21 is forced to emit light in an extremely short period of time. Upon the light emission of the organic EL device 21, the drive transistor 22, the write transistor 23, and the switching transistor 26 are irradiated with the light emitted from the organic EL device 21. FIG. 8A illustrates how the irradiation is performed, using a dashed line.

(Initialization Period)

The period from time $t_2$ to time $t_3$ subsequent to the deterioration suppression period is an initialization period during which an electric charge in the pixel circuit is reset and initialized. During the initialization period $t_2$-$t_3$, the power voltage DS is in a state of low voltage (Low), i.e., in a state of the second power voltage $V_{ini}$ as illustrated in FIG. 8B. During the initialization period $t_2$-$t_3$, all of the drive transistor 22, the write transistor 23, and the switching transistor 26 are in the electrically non-conductive state (OFF).

(Threshold Correction Period)

The period from time $t_3$ to time $t_4$ subsequent to the initialization period is a threshold correction period during which variation in the threshold voltage $V_{th\_Tr}$ of the drive transistor 22 is corrected. A circuit operation in the threshold correction period is described with reference to the explanatory operation diagram of FIG. 9A. During the threshold correction period $t_3$-$t_4$, the signal line 33 is in a state of low voltage (Low), i.e., in a state of the reference voltage $V_{ofs}$. In this state, the write scanning signal WS is brought into an active state. This brings the write transistor 23 into an electrically conductive state to sample the reference voltage $V_{ofs}$, which sampled reference voltage $V_{ofs}$ is written into the pixel 20.

Subsequently, the power voltage DS is switched over from the low voltage (Low), i.e., from the second power voltage $V_{ini}$ to high voltage (High), i.e., to the first power voltage $V_{ccp}$. This allows the source-drain region of the drive transistor 22 on the power supply line 32 side to serve as a drain region, and a source-drain region on the organic EL device 21 side to serve as a source region, so that a current flows through the drive transistor 22. The current flowing through the drive transistor 22 is used for charging the retention capacitor 24, the auxiliary capacitor 25, and an equivalent capacitor of the organic EL device 21. At this time, the source voltage $V_s$ of the drive transistor 22 increases with elapse of time.

Thereafter, the write scanning signal WS makes a transition from the active state to the non-active state, thereby allowing the write transistor 23 to be in an electrically non-conductive state. At this time, the gate-source voltage $V_{gs}$ of the drive transistor 22 is greater than the threshold voltage $V_{th\_Tr}$ of the drive transistor 22, and thus a current flows through the drive transistor 22. This allows both the gate voltage $V_g$ and the source voltage $V_s$ of the drive transistor 22 to increase.

Thus, a threshold correction processing (operation) refers to the processing (operation) in which the reference voltage $V_{ofs}$ is written into the gate electrode of the drive transistor 22, and in which the source voltage $V_s$ is varied toward the potential that is obtained by subtracting the threshold voltage $V_{th\_Tr}$ of the drive transistor 22 from the reference voltage $V_{ofs}$. At this time, a reverse bias is applied to the organic EL device 21 as long as an expression $V_s \leq V_{th\_EL} + V_{cath}$ holds true, and thus the organic EL device 21 does not emit light.

Repetition of the foregoing operation allows the gate-source voltage $V_{gs}$ of the drive transistor 22 to finally converge on the threshold voltage $V_{th\_Tr}$ of the drive transistor 22. A voltage equivalent to the threshold voltage $V_{th\_Tr}$ is retained by the retention capacitor 24. At this time, $V_s = V_{ofs} - V_{th} \leq V_{th\_EL} + V_{cath}$ holds true.

Note that, in this example, a drive method that performs so-called divisional threshold correction is employed, in which a threshold correction processing is divided to perform the processing a plurality of times. However, it goes without saying that a drive method that performs the threshold correction processing only once irrespective of the employment of the drive method of the divisional threshold correction. As used herein, the term "divisional threshold correction" is a drive method that divides the threshold correction processing to perform the processing a plurality of times over a plurality of horizontal periods prior to one horizontal period, in addition to the one horizontal period, in which the threshold correction processing is performed along with below-described signal writing process and mobility correction process.

According to the drive method of the divisional threshold correction, it is possible to secure a sufficient time for a threshold correction period over a plurality of horizontal periods, even when a time assigned to one horizontal period becomes shorter with increase in pixels due to higher resolution. This makes it possible to secure a sufficient time for the threshold correction period even when a time assigned to one horizontal period becomes shorter, thus enabling the threshold correction processing to be performed securely.

(Signal Writing and Mobility Correction Period)

The period from time t4 to t5 subsequent to the threshold correction period is a period for signal writing and mobility correction during which the signal voltage $V_{sig}$ of the image signal as a display signal is written and variation in the mobility u of the drive transistor 22 is corrected. A circuit operation in the signal writing and mobility correction is described with reference to the explanatory operation diagram of FIG. 9B. During the signal writing and mobility correction period $t_4$-$t_5$, the voltage of the signal line 33 is in a state of being switched over from the reference voltage $V_{ofs}$ to the signal voltage $V_{sig}$ of the image signal.

In a state where the signal voltage $V_{sig}$ of the image signal is supplied to the signal line 33, transition of the write scanning signal WS from the non-active state to the active state brings the write transistor 23 into an electrically conductive state to sample the signal voltage $V_{sig}$, which is written into the pixel 20. The writing of the signal voltage $V_{sig}$ brings the gate voltage $V_g$ of the drive transistor 22 into the signal voltage $V_{sig}$. Further, in driving by the drive transistor 22 with the signal voltage $V_{sig}$ of the image signal, the threshold voltage $V_{th\_Tr}$ of the drive transistor 22 is offset by a voltage equivalent to the threshold voltage $V_{th}$ retained by the retention capacitor 24, thereby allowing the threshold correction processing to be finally performed.

Further, the source voltage $V_s$ of the drive transistor 22 increases with elapse of time. At this time, unless the source voltage $V_s$ of the drive transistor 22 exceeds a sum of the threshold voltage $V_{th\_EL}$ of the organic EL device 21 and a cathode voltage $V_{cath}$, i.e., as long as a leak current of the organic EL device 21 is sufficiently smaller than a current flowing through the drive transistor 22, the current flowing through the drive transistor 22 flows through the retention capacitor 24, the auxiliary capacitor 25, and the equivalent capacitor of the organic EL device 21, thus starting the charging of these capacitors.

The charging of the retention capacitor 24, the auxiliary capacitor 25, and the equivalent capacitor of the organic EL device 21 allows the source voltage $V_s$ of the drive transistor 22 to increase with elapse of time. At this time, the correction processing (correction operation) of the threshold voltage $V_{th\_Tr}$ of the drive transistor 22 has already been completed, and thus the drain-source current $I_{ds}$ of the drive transistor 22 depends on the mobility u of the drive transistor 22.

Here, suppose that a ratio of a retention voltage $V_{gs}$ of the retention capacitor 24 to the signal voltage $V_{sig}$ of the image signal, i.e., a write gain G is one (ideal value), the source voltage $V_s$ of the drive transistor 22 increases to a potential of $V_{ofs} - V_{th\_Tr} + \Delta V$, thereby allowing the gate-source voltage $V_{gs}$ of the drive transistor 22 to be $V_{sig} - V_{ofs} + V_{th\_Tr} + \Delta V$.

That is, an increment of the increase $\Delta V$ of the source voltage $V_s$ of the drive transistor 22 affects in such a manner as to be subtracted from the voltage retained by the retention capacitor 24 ($V_{sig} - V_{ofs} + V_{th\_Tr}$), i.e., such that the electric charge charged in the retention capacitor 24 is discharged. In other words, it follows that the increment of the increase $\Delta V$ of the source voltage $V_s$ is a negative feedback applied to the retention capacitor 24. Accordingly, the increment of the increase $\Delta V$ of the source voltage $V_s$ is an amount of the negative feedback.

Thus, the application of the negative feedback to the gate-source voltage $V_{gs}$ by the negative feedback amount $\Delta V$ corresponding to the drain-source current $I_{ds}$ flowing through the drive transistor 22 makes it possible to negate the dependency of the drain-source current $I_{ds}$ of the drive transistor 22 on the mobility u. The processing to negate the dependency is the mobility correction processing (operation) to correct variation for each pixel in the mobility u of the drive transistor 22.

(Light Emission Period)

The period on and after time $t_5$ subsequent to the signal writing and mobility correction period is a light emission period during which the organic EL device 21 is driven to emit light. More specifically, the write scanning signal WS makes a transition from the active state to the non-active state at time $t_5$ to bring the write transistor 23 into an electrically non-conductive state, thereby allowing the operation into the light emission period. The circuit operation of the light emission period is described with reference to the explanatory operation diagram of FIG. 10. Note that, during the light emission period, the power voltage DS switches over as needed from the first power voltage $V_{ccp}$ to the second power voltage $V_{ini}$ for the duty control, as indicated by the broken line in FIG. 7.

The write transistor 23 is brought into an electrically non-conductive state, to thereby allow the gate electrode of the drive transistor 22 to be electrically separated from the signal line 33, causing the gate electrode to be in a floating state. When the gate electrode of the drive transistor 22 is in the floating state, the retention capacitor 24 is coupled between the gate and the source of the drive transistor 22, thereby also causing the gate voltage $V_g$ to fluctuate in association with fluctuation of the source voltage $V_s$ of the drive transistor 22. This allows the drain-source voltage $V_{ds}$ of the drive transistor 22 to be kept constant.

Thus, the operation in which the gate voltage $V_g$ of the drive transistor 22 fluctuates in association with the fluctuation of the source voltage $V_s$ thereof, in other words, the operation in which the gate voltage $V_g$ and the source voltage $V_s$ increase while keeping the gate-source voltage $V_{gs}$ retained by the retention capacitor 24 constant is defined as a bootstrap operation.

The gate electrode of the drive transistor 22 is brought into a floating state, and at the same time the drain-source current $I_{ds}$ of the drive transistor 22 starts to flow through the organic EL device 21, thereby allowing the anode electrode of the organic EL device 21 to increase in response to the current $I_{ds}$. Further, when the anode electrode of the organic EL device 21 exceeds $V_{th\_Tr}+V_{cath}$, a drive current starts to flow through the organic EL device 21, and thus the organic EL device 21 starts to emit light. Upon the light emission of the organic EL device 21, the light emitted by the organic EL device 21 irradiates the drive transistor 22, the write transistor 23, and the switching transistor 26. FIG. 10 illustrates how the irradiation is performed using a dashed line.

As can be appreciated from the foregoing description of the operation, during the light emission period, the write transistor 23 is in the electrically non-conductive state, and the write transistor 23 is unable to receive light emitted from the organic EL device 21 of an own pixel in the electrically conductive state. Accordingly, the write transistor 23 is unable to suppress the deterioration at light reception by receiving light emitted from the organic EL device 21 of the own pixel. In contrast, the drive transistor 22 is in the electrically conductive state at the time of the light emission of the organic EL device 21, and thus is able to suppress the deterioration at light reception by receiving light emitted from the organic EL device 21 of the own pixel.

Since the write transistor 23 is unable to suppress the deterioration at light reception by receiving light emitted from the organic EL device 21 of the own pixel during the light emission period, Embodiment 1 provides the deterioration suppression period. In this deterioration suppression period, the employed configuration thereby brings the write transistor 23 into an electrically conductive state and forcibly the organic EL device 21 of the own pixel to perform light emission driving of the organic EL device 21 of the own pixel on the basis of the predetermined voltage Vx. As a result, it is possible to obtain the following function and effect.

That is, even when the threshold voltage of the write transistor 23 shifts in a certain direction by receiving light emitted by the organic EL device 21 of the own pixel, the threshold voltage of the write transistor 23 shifts in a direction opposite to the certain direction by forcing the write transistor 23 into the electrically conductive state and forcing the organic EL device 21 to emit light. The characteristic shift in the opposite direction acts on the characteristic shift in the certain direction in such a manner as to reduce the degree of the shift. This makes it possible to suppress the deterioration of the characteristic of the write transistor 23 at light reception caused by reception of light emitted by the organic EL device 21.

The ability to suppress the deterioration of the characteristic of the write transistor 23 at light reception makes it possible to stabilize the characteristic of the write transistor 23. Therefore, it is possible to stably drive the organic EL display unit 10. Since the stabilization of the driving rarely causes operation failure of the organic EL display unit 10, it becomes possible to lengthen the life of the organic EL display unit 10. Furthermore, it is possible to suppress the deterioration of the characteristic of the write transistor 23 at light reception without providing the light-shielding layer that blocks light incident on the write transistor 23 from the organic EL device 21, thus making it possible to contribute to the enhancement of transmissivity (transparency) of the display panel 70 in the transparent display.

Further, in Embodiment 1, the deterioration suppression period during which the deterioration of the characteristic of the write transistor 23 at light reception is suppressed is provided prior to an entry into a display period during which display driving is performed on the basis of a display signal, in particular, prior to the initialization period. This allows an electric charge written into the pixel 20 with the operation that suppresses the deterioration at light reception not to influence the display of an original image, or not to influence the threshold correction or the mobility correction. In other words, it is preferable to set the deterioration suppression period prior to the initialization period in order to avoid the influences.

Embodiment 2

In Embodiment 2, the drive transistor 22 that drives the organic EL device 21 in accordance with the display signal (signal voltage $V_{sig}$ of the image signal), in addition to the write transistor 23, is adopted as the transistor to be corrected.

When a signal of "black" is written ceaselessly in the signal writing period in FIG. 7, no emission of the organic EL device 21 even in the light emission period leads to exhibition of black-colored display. Therefore, it is probable that no effect may be obtained for suppressing the deterioration of the characteristic of the drive transistor 22 at light reception. That is, when the black display is continuous over a long period of time, a possibility is considered that the drive transistor 22 may not receive the light emission of the organic EL device 21, causing the deterioration of the characteristic to proceed.

Thus, Embodiment 2 adopts a configuration of driving the drive transistor 22 also into an electrically conductive state in the deterioration suppression period. FIG. 11 illustrates control timing according to Embodiment 2. As illustrated in the timing waveform diagram in FIG. 11, in Embodiment 2, the signal output section 60 (see FIGS. 1 and 2) outputs to the signal line 33 a voltage $V_{dr}$ during the deterioration suppression period $t_1$-$t_2$ in which the signal line 33 is at the low voltage (Low), i.e., in the state of reference voltage $V_{ofs}$. The voltage $V_{dr}$ enables the drive transistor 22 to be in an electrically conductive state.

During the deterioration suppression period $t_1$-$t_2$, the write scanning signal WS is brought into the active state. Further, in response to the write scanning signal WS, the write transistor 23 is brought into the electrically conductive state (ON) to sample the voltage $V_{dr}$ of the signal line 33 and write the sampled voltage $V_{dr}$ into the pixel 20. As a result, the drive transistor 22 is brought into the electrically conductive state (ON) during the deterioration suppression period $t_1$-$t_2$. This allows all of the three transistors including the drive transistor 22, the write transistor 23, and the switching transistor 26 to be in an electrically conductive state, as illustrated in FIG. 12. That is, all of the three transistors are able to receive light emitted by the organic EL device 21 in the electrically conductive state, thus making it possible to suppress the deterioration of the transistor characteristic at light reception.

<Modification>

While, in the foregoing embodiments, descriptions have been given of cases where a technology of the disclosure is applied to the organic EL display unit in which the light-emitting section of the unit pixel 20 is formed of the organic EL device 21, a technology of the disclosure is not limited to the application to the organic EL display unit. That is, it is also possible for a technology of the disclosure to be applied to general display units of a configuration in which the unit pixel 20 includes a transistor that drives the light-emitting section. Non-limiting examples of the general display units may include a liquid crystal display unit and a display unit in which the light-emitting section of the unit pixel 20 is formed of a current-driven electrooptical device. Non-limiting examples of the current-driven electrooptical device may include an inorganic EL device, an LED device, and a semiconductor laser device.

Further, a technology of the disclosure exhibits a large suppression effect for the deterioration of the transistor characteristic at light reception particularly when being applied to a display unit in which the unit pixel (pixel circuit) 20 is formed of the oxide TFT; however, a technology of the disclosure is not limited to such a display unit. That is, the deterioration of the transistor characteristic at light reception occurs in no small degree by receiving light emitted by the light-emitting section of the own pixel, even when the pixel circuit is not a pixel circuit employing the oxide TFT. Accordingly, it is also possible for a technology of the disclosure to be applied to a display unit in which the unit pixel (pixel circuit) 20 does not employ the oxide TFT.

<Electronic Apparatus>

The foregoing display unit according to a technology of the disclosure may be used as a display section (display unit) of an electronic apparatus in every field in which an image signal inputted to the electronic apparatus or an image signal generated in the electronic apparatus is displayed as an image or a picture. The display unit may be used, for example, as a display section of electronic apparatuses such as a television set, a digital camera, a laptop personal computer, a mobile terminal including a mobile phone, a video camera, and a digital signage apparatus.

By thus employing the display unit of a technology of the disclosure as the display section in an electronic apparatus in every field, it is possible to obtain the following effects. That is, according to a technology of the disclosure, it is possible to stabilize the characteristic of a transistor forming a unit pixel (pixel circuit), thus enabling the display unit to be stably driven. Further, the stabilized driving prevents operation failure of the display unit, which contributes to longer life of an electronic apparatus that employs the display unit. In particular, in a case where the display unit is a transparent display, it is possible to suppress the deterioration of the transistor characteristic at light reception, without providing the light-shielding layer that blocks light incident on the transistor from the light-emitting section of the own pixel, which also contributes to the enhancement of transmissivity (transparency) of the transparent display.

The display unit according a technology of the disclosure also includes a module-shaped display unit with sealed configuration. An example thereof corresponds to a display module formed of a counter section such as a transparent glass attached to a pixel array section. Note that the display module may be provided with a flexible printed circuit (FPC) or a circuit section for receiving and outputting a signal or other elements related to the pixel array section from and to the outside. In the following, as a specific example of an electronic apparatus employing the display unit of the disclosure, there is described a digital signage apparatus that displays guide information or advertising. Note that the specific example described here is merely an example, and is not limitative.

Specific Example

FIG. 13 is a perspective view of an outer appearance of a digital signage apparatus which is an example of the display unit of the disclosure. The digital signage apparatus 100 illustrated in FIG. 13 includes a flat display panel provided on the front side of an outer housing 101. For example, the flat display panel may be a transparent display (organic EL display unit) 102, in which the light-emitting section of the unit pixel is formed of the organic EL device and the substrate is formed of a transparent substrate such as a glass substrate. The transparent display 102 forms an image display section that displays a binocular parallax image.

A capacitive sensor 103 is placed on a display surface of the transparent display 102. The capacitive sensor 103 forms a position information obtaining section that obtains information indicating three-dimensional positions (x, y, z) of an object present in a three-dimensional space over the display surface of the transparent display 102. Here, a hand of a user 104 may be set as the object. Further, the position information obtaining section obtains information of a distance z between the display surface of the transparent display 102 and the user 104.

When the user 104 comes closer to a displayed image of the transparent display 102 to a certain extent or more, the transparent display 102 displays a stereoscopic image of a predetermined content for advertising, for example, a binocular parallax image that allows the user 104 to visually recognize a content such as merchandise or a character.

When the user 104 holds out a hand to cause the position of the hand closer to the display surface, the display mode is changed to a mode in which the content such as merchandise or a character is visually recognized on the hand. Then, when the user 104 moves the position of the hand, the visually recognized position of the content such as merchandise or a character moves to follow the position of the hand.

As described above, the application of a technology of the disclosure to the digital signage apparatus 100 that employs the transparent display 102 makes it possible to stabilize the characteristic of a transistor forming a pixel circuit, thus enabling the transparent display 102 to be stably driven. Further, the stabilized driving rarely causes operation failure of the transparent display 102, which contributes to longer life of the digital signage apparatus 100. Further, it is possible to suppress the deterioration of the transistor characteristic at light reception, without providing a light-shielding layer that blocks light incident on the transistor from the light-emitting section of the own pixel, which also contributes to the enhancement of transmissivity (transparency) of the transparent display 102.

Note that the disclosure may be configured as follows.

[1] A display unit including:
a pixel array section in which unit pixels are disposed, the unit pixels each including a light-emitting section; and
a drive section that performs, during a non-display period other than a display period, light emission driving of the light-emitting section on a basis of a predetermined voltage, and causes, during the non-display period, a transistor to be corrected to be in an electrically conductive state, the transistor being provided in each of the unit pixels, the display period being a period during which display driving is performed on a basis of a display signal.

[2] The display unit according to [1], wherein
a correction period is provided prior to an entry into the display period, the correction period being a period during which correction of a characteristic of the transistor in each of the unit pixels is performed, and
the drive section performs, prior to an entry into the correction period, the light emission driving of the light-emitting section on the basis of the predetermined voltage.

[3] The display unit according to [1] or [2], wherein the transistor to be corrected includes a write transistor that writes the display signal into the unit pixel.

[4] The display unit according to any one of [1] to [3], wherein the transistor to be corrected includes a drive transistor that drives the light-emitting section depending on the display signal.

[5] The display unit according to any one of [1] to [4], wherein the transistor to be corrected includes a thin film transistor that employs an oxide semiconductor as a channel layer.

[6] The display unit according to any one of [1] to [5], wherein each of the unit pixels includes a switching device that selectively applies the predetermined voltage to the light-emitting section in driving, by application of the predetermined voltage, the light-emitting section.

[7] The display unit according to [6], wherein the switching device includes a switching transistor coupled between a node of the light-emitting section to which the predetermined voltage is applied and a voltage source of the predetermined voltage, and
the drive section causes the switching transistor to be in an electrically conductive state when causing the transistor to be corrected to be in the electrically conductive state.

[8] The display unit according to any one of [4] to [7], wherein the predetermined voltage is set to have a voltage value that satisfies the following condition:

$$V_g - V_{th\_Tr} > V_x > V_{cath} + V_{th\_EL}$$

where $V_x$ is the predetermined voltage, $V_{cath}$ is a voltage of a node opposite to a node of the light-emitting section to which the predetermined voltage is applied, $V_{th\_EL}$ is a threshold voltage of the light-emitting section, $V_g$ is a gate voltage of the drive transistor, and $V_{th\_Tr}$ is a threshold voltage of the drive transistor.

[9] The display unit according to any one of [1] to [8], wherein the drive section sequentially drives the unit pixels on a pixel row basis for a pixel arrangement, the pixel arrangement including the unit pixels that are two-dimensionally arranged in matrix.

[10] The display unit according to any one of [1] to [9], wherein each of the unit pixels of the pixel array section is fabricated on a transparent substrate.

[11] The display unit according to any one of [1] to [10], wherein the light-emitting section of each of the unit pixels includes a current-driven electrooptical device.

[12] A display unit driving method that performs driving of a display unit, the display unit being provided with a pixel array section in which unit pixels each including a light-emitting section are disposed, the method including:
performing, during a non-display period other than a display period, light emission driving of the light-emitting section on a basis of a predetermined voltage upon performing the driving; and
causing, during the non-display period, a transistor to be corrected to be in an electrically conductive state upon performing the driving, the transistor being provided in each of the unit pixels, the display period being a period during which display driving is performed on a basis of a display signal.

[13] An electronic apparatus provided with a display unit, the display unit including:
a pixel array section in which unit pixels are disposed, the unit pixels each including a light-emitting section; and
a drive section that performs, during a non-display period other than a display period, light emission driving of the light-emitting section on a basis of a predetermined voltage, and causes, during the non-display period, a transistor to be corrected to be in an electrically conductive state, the transistor being provided in each of the unit pixels, the display period being a period during which display driving is performed on a basis of a display signal.

REFERENCE SIGNS LIST

10 . . . organic EL display unit, 20 . . . unit pixel (pixel circuit), 21 . . . organic EL device, 22 . . . drive transistor, 23 . . . write transistor, 24 . . . retention capacitor, 25 . . . auxiliary capacitor, 26 . . . switching transistor, 30 . . . pixel array section, 31 ($31_1$ to $31_m$) . . . scan line, 32 ($32_1$ to $32_m$) . . . power supply line, 33 ($33_1$ to $33_n$) . . . signal line, 34 . . . common power line, 35 . . . fixed voltage power source, 40 . . . write scanning section, 50 . . . power supply scanning section, 60 . . . signal output section, 70 . . . display panel, 80 . . . deterioration suppression scanning section, 100 . . . digital signage apparatus, 101 . . . outer housing, 102 . . . transparent display, 103 . . . capacitive sensor

The invention claimed is:

1. A display unit comprising:
a pixel array section including unit pixels, the unit pixels each including a light-emitting section; and a drive section that causes, during a non-display period other than a display period, a transistor to be corrected to be in an electrically conductive state, and performs, during the non-display period, light emission driving of the light-emitting section on a basis of a predetermined voltage, an instance of the transistor being respectively provided in each of the unit pixels, the display period being a period during which display driving is performed on a basis of a display signal, wherein the transistor comprises a drive transistor that drives the light-emitting section depending on the display signal, and the predetermined voltage is set to have a voltage value that satisfies the following condition:

$$V_g - V_{th\_Tr} > V_x > V_{cath} + V_{th\_EL}$$

where $V_x$ is the predetermined voltage, $V_{cath}$ is a voltage of a node opposite to a node of the light-emitting section to which the predetermined voltage is applied, $V_{th\_EL}$ is a threshold voltage of the light-emitting section, $V_g$ is a gate voltage of the drive transistor, and $V_{th\_Tr}$ is a threshold voltage of the drive transistor.

2. The display unit according to claim 1, wherein a correction period is provided prior to an entry into the display period, the correction period being a period during which correction of a characteristic of the transistor in each of the unit pixels is performed, and the drive section performs, prior to an entry into the correction period, the light emission driving of the light-emitting section on the basis of the predetermined voltage.

3. The display unit according to claim 1, wherein another transistor to be corrected comprises a write transistor that writes the display signal into the unit pixel.

4. The display unit according to claim 1, wherein the transistor to be corrected comprises a thin film transistor that employs an oxide semiconductor as a channel layer.

5. The display unit according to claim 1, wherein each of the unit pixels includes a switching device that selectively applies the predetermined voltage to the light-emitting section in driving, by application of the predetermined voltage, the light-emitting section.

6. The display unit according to claim 5, wherein the switching device includes a switching transistor coupled between a node of the light-emitting section to which the predetermined voltage is applied and a voltage source of the predetermined voltage, and the drive section causes the switching transistor to be in an electrically conductive state when causing the transistor to be corrected to be in the electrically conductive state.

7. The display unit according to claim 1, wherein the drive section sequentially drives the unit pixels on a pixel row basis for a pixel arrangement, the pixel arrangement including the unit pixels that are two-dimensionally arranged in matrix.

8. The display unit according to claim 1, wherein each of the unit pixels of the pixel array section is fabricated on a transparent substrate.

9. The display unit according to claim 1, wherein the light-emitting section of each of the unit pixels includes a current-driven electrooptical device.

10. A display unit driving method that performs driving of a display unit, the display unit being provided with a pixel array section in which unit pixels each including a light-emitting section are disposed, the method comprising:

causing, during a non-display period other than a display period, a transistor to be corrected to be in an electrically conductive state upon performing the driving, an instance of the transistor being respectively provided in each of the unit pixels, the display period being a period during which display driving is performed on a basis of a display signal; and performing, during the non-display period, light emission driving of the light-emitting section on a basis of a predetermined voltage upon performing the driving, wherein the transistor comprises a drive transistor that drives the light-emitting section depending on the display signal, and the predetermined voltage is set to have a voltage value that satisfies the following condition:

$$V_g - V_{th\_Tr} > V_x > V_{cath} + V_{th\_EL}$$

where $V_x$ is the predetermined voltage, $V_{cath}$ is a voltage of a node opposite to a node of the light-emitting section to which the predetermined voltage is applied, $V_{th\_EL}$ is a threshold voltage of the light-emitting section, $V_g$ is a gate voltage of the drive transistor, and $V_{th\_Tr}$ is a threshold voltage of the drive transistor.

11. An electronic apparatus provided with a display unit, the display unit comprising:

a pixel array section including unit pixels, the unit pixels each including a light-emitting section; and a drive section that causes, during a non-display period other than a display period, a transistor to be corrected to be in an electrically conductive state, and performs, during the non-display period, light emission driving of the light-emitting section on a basis of a predetermined voltage, an instance of the transistor being respectively provided in each of the unit pixels, the display period being a period during which display driving is performed on a basis of a display signal, wherein the transistor comprises a drive transistor that drives the light-emitting section depending on the display signal, and the predetermined voltage is set to have a voltage value that satisfies the following condition:

$$V_g - V_{th\_Tr} > V_x > V_{cath} + V_{th\_EL}$$

where $V_x$ is the predetermined voltage, $V_{cath}$ is a voltage of a node opposite to a node of the light-emitting section to which the predetermined voltage is applied, $V_{th\_EL}$ is a threshold voltage of the light-emitting section, $V_g$ is a gate voltage of the drive transistor, and $V_{th\_Tr}$ is a threshold voltage of the drive transistor.

* * * * *